United States Patent
Frankenberger

(10) Patent No.: US 9,462,700 B2
(45) Date of Patent: Oct. 4, 2016

(54) METHOD FOR PRODUCING AN AIRCRAFT STRUCTURE COMPONENT HAVING AN OUTER SKIN PROVIDED WITH ELECTRIC CONDUCTOR ELEMENTS

(71) Applicant: Airbus Operations GmbH, Hamburg (DE)

(72) Inventor: Eckart Frankenberger, Hamburg (DE)

(73) Assignee: Airbus Operations GmbH, Hamburg (DE)

( * ) Notice: Subject to any disclaimer, the term of this patent is extended or adjusted under 35 U.S.C. 154(b) by 294 days.

(21) Appl. No.: 14/016,832

(22) Filed: Sep. 3, 2013

(65) Prior Publication Data
US 2014/0234552 A1    Aug. 21, 2014

Related U.S. Application Data

(60) Provisional application No. 61/696,615, filed on Sep. 4, 2012.

(30) Foreign Application Priority Data

Sep. 4, 2012  (EP) ..................... 12182904

(51) Int. Cl.
*H05K 3/22* (2006.01)
*B64C 1/00* (2006.01)
*B64D 15/12* (2006.01)
(Continued)

(52) U.S. Cl.
CPC ................ *H05K 3/222* (2013.01); *B64C 1/00* (2013.01); *B64C 1/12* (2013.01); *B64D 15/12* (2013.01); *B64D 43/00* (2013.01); *B64D 45/02* (2013.01); *G01B 7/18* (2013.01); *H05K 3/125* (2013.01);
(Continued)

(58) Field of Classification Search
None
See application file for complete search history.

(56) References Cited

U.S. PATENT DOCUMENTS 3,436,816 A * 4/1969 Lemelson .................. 29/611
4,032,089 A   6/1977 Kinzler et al.
(Continued)

FOREIGN PATENT DOCUMENTS

AU   2009/309436 A2   7/2011
CN   101 811 580 A    8/2010
(Continued)

OTHER PUBLICATIONS

European Search Report for Application No. EP 12 18 2904 dated Jan. 29, 2013.
(Continued)

*Primary Examiner* — Michael P Rodriguez
(74) *Attorney, Agent, or Firm* — Jenkins, Wilson, Taylor & Hunt, P.A.

(57) ABSTRACT

A method for producing an aircraft structure component is disclosed the component having an outer skin provided with electric conductor elements. The method includes providing an aircraft structure component having an outer skin, applying particles of electrically conductive material onto the outer surface of the outer skin of said aircraft structure component in a predetermined pattern, such that the accumulated particles of electrically conductive material form electric conductor elements along the outer surface of the outer skin, and applying particles of electrically insulating material onto the outer surface of the outer skin of said aircraft structure component in a predetermined pattern, such that the accumulated particles of electrically isolating material form an insulating layer for the electric conductor elements.

16 Claims, 5 Drawing Sheets

(51) Int. Cl.
*B64D 45/02* (2006.01)
*H05K 3/12* (2006.01)
*G01B 7/16* (2006.01)
*B64D 43/00* (2006.01)
*B64C 1/12* (2006.01)
*H05K 1/16* (2006.01)
*H05K 3/10* (2006.01)
*H05K 3/28* (2006.01)

(52) U.S. Cl.
CPC ............... *H05K 1/16* (2013.01); *H05K 1/167* (2013.01); *H05K 3/10* (2013.01); *H05K 3/28* (2013.01)

(56) References Cited

U.S. PATENT DOCUMENTS

| | | | | |
|---|---|---|---|---|
| 6,077,132 | A * | 6/2000 | Gligorijevic | 439/891 |
| 6,083,615 | A * | 7/2000 | Long | C09D 183/04 |
| | | | | 156/276 |
| 6,327,132 | B1 * | 12/2001 | Andrivet | B29C 70/885 |
| | | | | 244/1 A |
| 7,018,217 | B2 * | 3/2006 | Marshall | B32B 3/08 |
| | | | | 174/117 FF |
| 7,686,905 | B2 | 3/2010 | Ackerman et al. | |
| 8,521,448 | B1 * | 8/2013 | Ung | B64F 5/0045 |
| | | | | 702/42 |
| 2003/0129297 | A1 * | 7/2003 | Jakobi et al. | 427/66 |
| 2005/0041362 | A1 | 2/2005 | Hall | |
| 2005/0213278 | A1 * | 9/2005 | Hawley | B64D 45/02 |
| | | | | 361/212 |
| 2007/0062300 | A1 * | 3/2007 | Dorfman | 73/776 |
| 2008/0028956 | A1 * | 2/2008 | Sedberry et al. | 101/129 |
| 2009/0117322 | A1 * | 5/2009 | Larsen et al. | 428/137 |
| 2010/0035375 | A1 * | 2/2010 | Grigoropoulos et al. | 438/99 |
| 2010/0155538 | A1 | 6/2010 | Calder | |
| 2011/0203937 | A1 | 8/2011 | Sidhu | |

FOREIGN PATENT DOCUMENTS

| | | |
|---|---|---|
| CN | 101 947 860 A | 1/2011 |
| EP | 1 486 417 | 12/2004 |
| EP | 1 944 236 | 7/2008 |
| EP | 12182904.8 | 9/2012 |
| JP | 2006/275752 | 10/2006 |
| WO | WO 2005/105445 A1 | 11/2005 |

OTHER PUBLICATIONS

Chinese Office Action for Application No. 201310392534.9 dated Jul. 3, 2015.
Chinese Search Report for Application No. 201310392534.9 dated Nov. 5, 2015.
Chinese Office Action for Application No. 201310392534.9 dated Nov. 23, 2015.

* cited by examiner

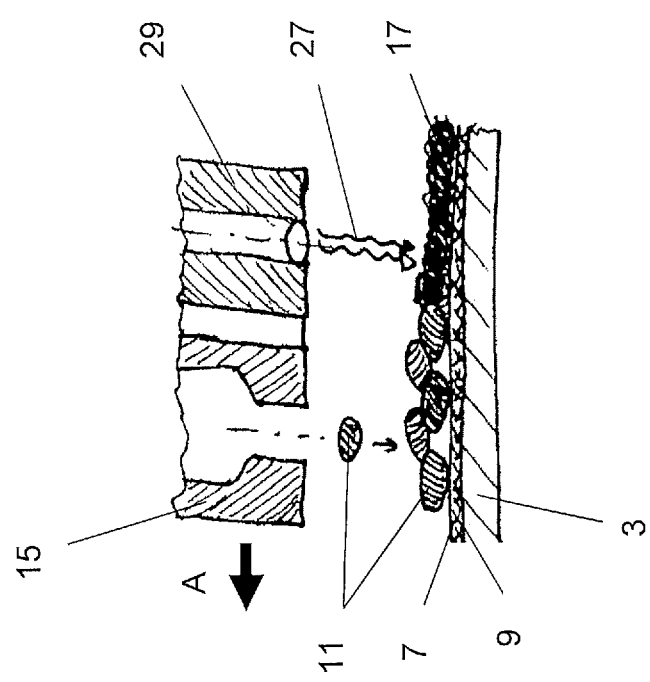
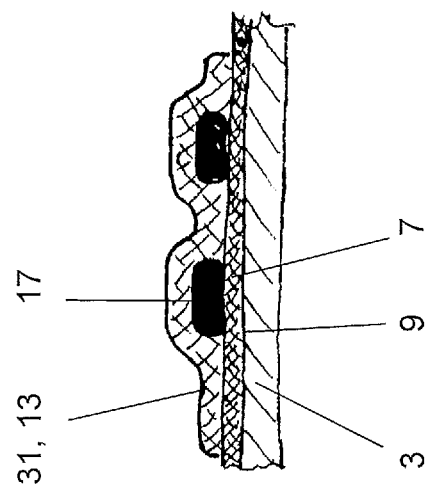
Fig. 2
Fig. 3

METHOD FOR PRODUCING AN AIRCRAFT STRUCTURE COMPONENT HAVING AN OUTER SKIN PROVIDED WITH ELECTRIC CONDUCTOR ELEMENTS

CROSS-REFERENCE TO RELATED APPLICATIONS

This application claims priority to and the benefit of European Patent Application No. EP 12182904.8 and to U.S. Provisional Application No. 61/696,615, both of which were filed on Sep. 4, 2012, the entire disclosures of which are both incorporated by reference herein

TECHNICAL FIELD

The present invention relates to a method for producing an aircraft structure component having an outer skin provided with electric conductor elements.

BACKGROUND

Aircraft structure components within the meaning of the present invention may be any kind of aircraft structure component, in particular the fuselage or fuselage sections, wings or wing sections, tail units, rudders, elevator assemblies, ailerons, high lift systems, engine cowl, or the similar, as well as parts of the afore-mentioned.

The methods for making an aircraft structure component known in the art usually after the assembly of the aircraft structure component having an outer skin, the step of varnishing the outer surface of said outer skin by means of a spray pistol, which step is usually very time consuming. The varnishes used in the art do not have particular electrically conductive properties. The aircraft structure component itself is usually made of a metallic or a fiber composite material which is characterized by a certain electric conductivity. However, the aircraft structure component may only conduct electric current as a whole in a rather diffuse manner and no discrete electric conductor elements are provided.

Yet, electric conductor elements provided on the outer skin of aircraft structure components may serve for several advantageous applications, such as a lightning protection system, a structure health monitoring system, a deicing system, a cosmic radiation shielding system, or an illuminating system. Therefore it is desirable to produce aircraft structure components having an outer skin provided with electric conductor elements.

However, it is rather complex and expensive as well as disadvantageous from the aerodynamic point of view to install electrical conductor paths for example in the form of wires on the outer surface of the outer skin of aircraft structure components.

SUMMARY

Therefore, it is the object of the present invention to provide a simple and cost-effective method for producing an aircraft structure component having an outer skin provided with electric conductor elements, wherein the electric conductor elements do not negatively affect the flight characteristics of the aircraft.

This problem is solved by a method for producing an aircraft structure component having an outer skin provided with electric conductor elements, said method comprising the steps of:

a. providing an aircraft structure component having an outer skin, b. applying particles of electrically conductive material onto the outer surface of the outer skin of said aircraft structure component in a predetermined pattern, such that the accumulated particles of electrically conductive material form electric conductor elements along the outer surface of the outer skin, and c. applying particles of electrically insulating material onto the outer surface of the outer skin of said aircraft structure component in a predetermined pattern, such that the accumulated particles of electrically insulating material form an insulating layer for the electric conductor elements.

By such method electric conductor elements can be provided on the outer surface of the outer skin of an aircraft structure component in a reliable and uncomplicated manner by coating said outer surface with paths of particles of electrically conductive material and insulating said paths at least partly by a coat of particles of electrically insulating material. Particles of electrically conductive and electrically insulating material are useful as coating material, as particles may easily be applied onto an aircraft structure component outer surface, e.g. with an ink jet printing method by means of an ink jet printing device. In such a way no additional separate electric conductor elements need to be installed on the aircraft structure component and no electric conductor elements protrude from the outer surface of the outer skin of said aircraft structure component in order to obtain an arrangement of electric conductor elements, e.g. a grid of electric conductor elements for lightning protection, health monitoring, deicing, etc., on the outer surface of the aircraft structure component's outer skin. A highly planar outer surface of said outer skin can still be provided as the thickness of the conductor elements and the insulating layer can be kept small. Production cost efficiency can be increased and flight characteristics can be improved as well.

Particles of electrically conductive material within the meaning of the present invention may be of any kind of material suitable for conducting electric current, in particular a metallic material such as copper, aluminium, wolfram, brass, iron, chrome, or associated alloys, a semiconductor material such as silicon, or a non-metallic material such as graphite. Particles of electrically insulating material within the meaning of the present invention may for example be a plastic or ceramic material. However, other materials such as insulating laquers may be employed as well.

A primer layer may be applied onto the outer surface of the outer skin of said aircraft structure component in order to increase adhesion of the particles of electrically conductive material and the particles of electrically insulating material on said outer surface of the outer skin. The primer layer may be applied onto said outer surface of the outer skin by the same method with which the particles of electrically conductive and/or insulating material are applied, i.e. for example by means of an ink jet printing device.

The particles of electrically insulating material may be applied onto the outer surface of the outer skin of the aircraft structure component, onto the primer layer and onto the particles of electrically conductive material forming electric conductor elements, so that the insulating layer insulates the electric conductor elements to the aircraft structure component, the primer layer, and the environment, i.e. the particles of electrically conductive material may be applied either onto the plain outer surface of the outer skin of the aircraft structure component, onto the primer layer, or onto a first insulating layer, as applicable. However, the insulating layer may be formed discontinuously, so that at certain locations the electric conductor element is not insulated and may be connected to another electric conductor element by e.g. a plug or a switch.

The predetermined patterns, i.e. the topography, the lateral size and the width, according to which the particles of electrically conductive and electrically insulating material are applied onto the aircraft structure component are controlled by the temporal variation of the position at which said particles of electrically conductive and/or insulating material are applied onto said outer surface of the outer skin of the aircraft structure components, as well as on the mass flow rate of said particles of electrically conductive and/or insulating material which are applied onto said outer surface of the outer skin. In this manner, such patterns control the extent, in particular the thickness, width, and length, as well as the direction and shape of the extension of the electric conductor elements and/or the insulating layer, i.e. the predetermined patterns define the paths and the shape as well as the properties of the electric conductor elements and the insulating layer.

The electric conductor elements may be connected to the inner surface of the outer skin of the aircraft structure component and thereby to the interior of said aircraft structure component by means of e.g. the rivets received in the aircraft structure component outer skin. Said rivets may be contacted by the electric conductor elements at the outer skin outer surface and the metallic material of the rivets may form the conductor to the inner surface and the inside of said aircraft structure component, respectively, where an electric signal, voltage or current may be processed by a computer or controlled by a controlling device.

According to a preferred embodiment afore-mentioned steps b. and c. are carried out repeatedly in such an order and by means of such predetermined patterns that an electric circuit element is formed on the outer surface of the outer skin. An electric circuit element within the meaning of the present invention may be any kind of electric circuit element, for example a resistor, a diode, a transistor, a capacitor, an inductor, an operational amplifier, or other circuit elements. In particular, switches, sensors and actuators may be formed in such a manner. Layers of particles of electrically insulating material and layers of particles of electrically conductive material may be applied to the outer surface of the outer skin of the aircraft structure component alternately, wherein each layer is formed in such a way that a certain structure of electric conductor elements is embedded in a matrix of electric insulating material, thereby together forming a such electric circuit element or elements. Thus, this embodiment facilitates the formation of actuators like switches on the outer surface of the structure component, the actuators being connected with the interior of the structure component via the rivets so that complex feed-throughs are avoided.

According to a further preferred embodiment the particles of electrically conductive material and/or the particles of electrically insulating material are applied onto the outer surface of the outer skin of said aircraft structure component by means of an ink jet printing device. Such ink jet printing device may be any kind of ink jet printing device, in particular a drop on demand ink jet printing device having a bubble jet print head, a piezo print head, or a pressure valve print head. Further, the operation of the ink jet printing device, in particular the operation of the print head, is preferably controlled by a digital controlling device which is adapted to be programmed for controlling the print head to apply particles of electrically conductive material and particles of electrically insulating material onto the outer surface of the outer skin of the aircraft structure component in a predetermined pattern.

The ink jet printing device may also comprise a distance sensor adapted to measure the distance between the print head and the respective position on the surface to be coated, so that for different distances a different amount of particles of electrically conductive or electrically insulating material may be applied to said surface in order to form a preferably planar outer surface of the insulating layer and/or electric conductor element. Multiple print heads applying particles of electric conductive material and particles of electric insulating material in parallel are also conceivable. Further, a laser device may be provided directly on or separate from the ink jet printing device in order to apply laser radiation onto the particles of electrically conductive and/or electrically insulating material, thereby laser sintering the electric conductor element and the insulating layer, respectively.

In another preferred embodiment the electric conductor elements are formed as a lightning protection arrangement. In particular, it is preferred that the lightning protection arrangement comprises a grid of multiple electric conductor elements. In this manner the grid of electric conductor elements extends along the outer surface of the aircraft structure component outer skin and preferably along the entire aircraft outer skin, thereby forming a Faraday cage around said aircraft. The electric conductor elements may not be covered by the insulating layer to the outside of said outer skin, i.e. the electric conductor elements extend naked and not insulated to the environment, so that they may be approached by possible lightning. However, the electric conductor elements should be insulated with respect to the outer skin of the aircraft structure component onto which said electric conductor elements are applied. Such lightning protection arrangement is particularly advantageous in the case of aircraft structure components made of fiber composite material, as many fiber composite materials show considerably lower electric conductivity compared to common aluminium structures and therefore may not be able to form an effective Faraday cage.

In an alternative preferred embodiment the electric conductor elements are formed as resistance strain gauges for detecting strain occurring on said aircraft structure component. The predetermined pattern of a resistance strain gauge includes one or a plurality of straight conductors sections having a width which is small compared to the length of the conductor section, so that a change of the dimensions of the substrate for the conductor, in the present case the outer skin of the structure component, in the longitudinal direction of the conductor section effects a change of the cross section of the conductor section and, hence, of the resistance. This general principle of a resistance strain gauge is known in the art. However, the method according to the present invention allows to arrange a plurality of such gauges on the outer skin of a structure component so that changes in the dimensions of the component can easily be detected via the corresponding resistance changes. The single resistance strain gauges may be connected by electric conductor elements to a health monitoring controlling device.

The electric conductor elements according to another alternative preferred embodiment are formed as a resistance heating arrangement. In particular, it is preferred that the resistance heating arrangement comprises a grid of multiple electric conductor elements formed as heating resistance elements. The heating resistance elements are characterized by a considerable high electric resistance in order to heat-up caused by the flow of electric current, and to transfer their heat to the aircraft structure component outer skin onto which they are applied. In such a manner the resistance heating arrangement may serve for deicing outer surface of the respective aircraft structure component outer skin.

The electric conductor elements according to yet another alternative preferred embodiment are formed as a shielding arrangement for shielding perturbing radiation, in particular cosmic radiation. In particular, it is preferred that the shielding arrangement comprises a grid of multiple electric conductor elements. Such a grid of electric conductor elements, e.g. of aluminium or copper material, helps effectively shielding cosmic radiation or other perturbing radiation, which generally poses a considerable health risk for any passenger or crew member onboard of an aircraft.

The electric conductor elements in yet another alternative preferred embodiment are formed as an illuminating arrangement comprising one or more illuminating elements. Such illuminating elements may be formed by a plurality of carbon nano tubes which are embedded in said electric conductor elements. Said carbon nano tubes may preferably be admixed to the particles of electrically conductive material before applied to the outer surface of the outer skin of the respective aircraft structure component. However, the carbon nano tubes may also be applied onto the matrix of particles of electrically conductive material after application of said particles onto the aircraft structure component outer skin outer surface, for example admixed to a carrier material which is applied onto the layer of particles of electrically conductive material forming the electric conductor elements. Said carrier material may also be applied by an ink jet printing device. The carbon nano tubes may be any kind of carbon nano tubes capable of illuminating, in particular.

Such illuminating elements may be applied to the outer surface of the outer skin of the aircraft structure component wherever a light source is required. For instance, the illuminating elements may be applied to the lateral tips of the wings in order to form position lights, or to the wing surface and the fuselage for service or maintenance purposes. Different colours are possible.

In a further preferred embodiment said aircraft structure component comprises at least one plug element having a pin, wherein particles of electrically conductive material are applied onto the outer surface of said pin, such that the accumulated particles of electrically conductive material form an electrically conductive outer contact layer along the outer surface of the pin, said electrically conductive outer contact layer being connected to an electric conductor element formed on the outer surface of the outer skin of said aircraft structure component. The particles of electrically conductive material applied onto the outer surface of the pin in order to form the outer contact layer may be of the same material and may be applied in the same manner as the particles of electrically conductive material applied onto the outer surface of the outer skin of the respective aircraft structure component, i.e. for example by means of an ink jet printing device. The pin may be of any shape and preferably fits into a cavity of a respective socket element. In such a way an electric connection element is obtained in form of the plug element which may help to electrically connect different sections within the respective aircraft structure component, or to connect said aircraft structure component to a further aircraft structure component.

In particular, it is preferred that a further aircraft structure component comprises at least one socket element having a cavity, wherein particles of electrically conductive material are applied onto a surface of the socket element surrounding said cavity, such that the accumulated particles of electrically conductive material form an electrically conductive contact layer along the surface of the socket element, said electrically conductive contact layer being connected to an electric conductor element formed on the outer surface of the outer skin of said aircraft structure component. The particles of electrically conductive material applied onto the surface of the socket element in order to form the contact layer may be of the same material and may be applied in the same manner as the particles of electrically conductive material applied onto the outer surface of the outer skin of the respective aircraft structure component, i.e. for example by means of an ink jet printing device. The cavity formed into the socket element may be of any shape and preferably may receive a pin of a respective plug element. In such a way an electric connection element is obtained in form of the socket element which may help to electrically connect different sections within the respective aircraft structure component, or to connect said aircraft structure component to a further aircraft structure component.

More particular, it is preferred that at least one pin fits inside at least one cavity. In such a manner a plug socket connection may be established between two sections of an aircraft structure component which can be separated from one another, for example in the case of a door in the fuselage or a flap on the wing, or between one aircraft structure component and another aircraft structure component. The plug socket connection guarantees that these two component section or aircraft structure components may be brought into a connected state, where the pin of the plug element fits in cavity of the socket element thereby establishing an electric connection between the outer and inner contact layer, and into a disconnected state, where outer and inner contact layer are not in contact to one another.

An insulating layer may be applied onto sections of the plug including the pin as well as onto sections of the socket element. However, certain sections on the outer surface of the pin need to remain uncoated in order to establish an electric connection between the plug element and the socket element. The insulating layer applied onto the plug element or the socket element may be applied in the same manner as the insulating layer applied onto the outer surface of the outer skin of the aircraft structure component, i.e. for example by means of an ink jet printing device.

According to another preferred embodiment after the step of applying particles of electrically conductive material onto the outer surface of the outer skin of an aircraft structure component, a step of applying laser radiation onto the electric conductor elements by means of a laser device is performed, such that the particles of electrically conductive material in the electric conductor elements melt due to the heat transferred to the particles via the laser radiation, i.e. the particles are laser sintered. The laser device may be any kind of laser device adapted for laser sintering said particles of electrically conductive material. Also the insulating layer of particles of electrically insulating material may be laser sintered by the laser device. After the electric conductor elements and the insulating layer have been laser sintered, i.e. after the application of laser radiation onto their particles of electrically conductive and electrically insulating material, they are solidified and thus their shape has become fixed in a predetermined pattern. In addition, melting of the particles and subsequent solidifying results in an integrally formed conductor element without grain boundaries at which oxidation may occur leading to an increased resistance of the conductor element. The laser device is arranged behind any devices provided for application of particles of electrically conductive and/or electrically insulating material when seen in the moving direction of the devices so that irradiation subsequent to application of the particles is easily possible.

BRIEF DESCRIPTION OF THE DRAWINGS

In the following various embodiments of the method for producing aircraft structure components according to the present invention are described by means of a drawing. The drawing shows in FIG. 1 a flow diagram of the method according to the present invention including various possible embodiments for carrying out said method, FIG. 2 a cross sectional view of the outer surface of the outer skin of an aircraft structure component in the process of being coated according to the present invention with particles of electrically conductive material by means of a ink jet printing device and subsequently laser sintered by means of a laser device, FIG. 3 a cross sectional view of the outer surface of the outer skin of the completed aircraft structure component according to FIG. 2, said outer surface being provided with an additional insulating layer, FIG. 4 a perspective view of an aircraft fuselage section produced in accordance with a method of the present invention, FIG. 5 a cross sectional view of a plug element produced in accordance with a method according to the present invention, FIG. 6 a cross sectional view of a plug element produced in accordance with a method of the present invention, said plug element having multiple pins, FIG. 7 a cross sectional view of a socket element produced in accordance with a method according to the present invention, said socket element having multiple cavities, and FIG. 8 a cross sectional view of the outer skin of an aircraft structure component produced in accordance with the present invention, an electric conductor element on the outer surface of said outer skin being connected to a rivet, and FIG. 9 plane view of the pattern of the conductor element of a resistance strain gauge formed by a method according to the present invention.

DETAILED DESCRIPTION

Figure 1:
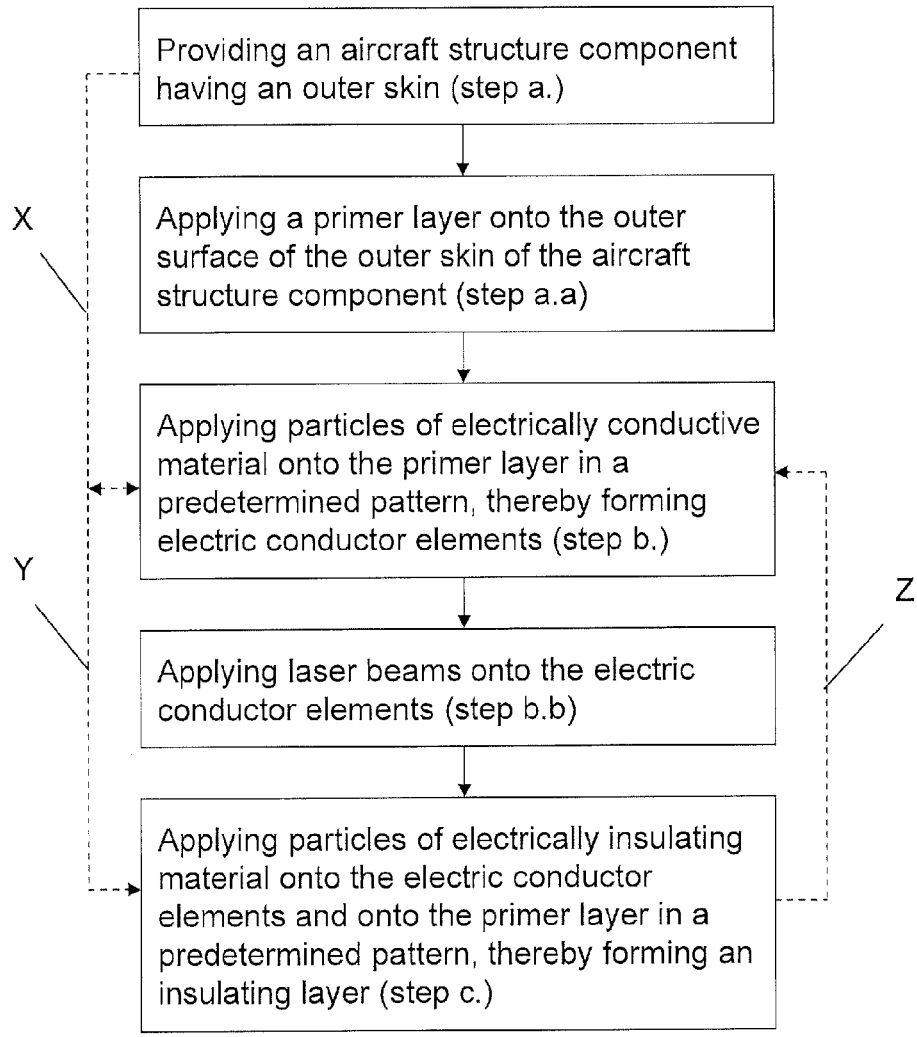
Figure 4:
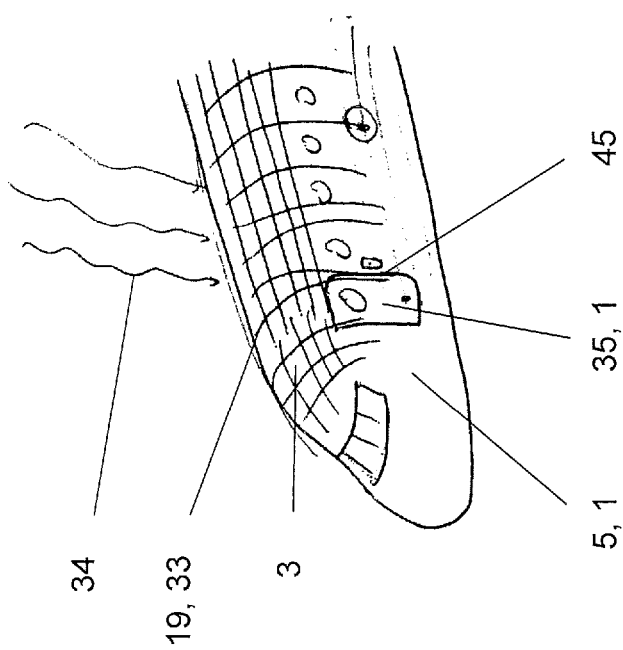

In FIG. 1 a flow chart is presented illustrating multiple embodiments of the method according to the present invention. A preferred embodiment of said method includes the following steps:

At first, an aircraft structure component 1 is provided, having an outer skin 3 (step a.). Said aircraft structure component 1 may basically be any kind of aircraft structure component, e.g. section of wing, tail unit, rudder, elevator assemblies, aileron, high lift systems, engine cowl, etc., but in the present embodiment it is a fuselage section, in particular a fuselage front section 5, as illustrated in FIG. 4. The outer skin 3 of said aircraft structure component 1 may generally be of e.g. aluminium or fiber composite material, and in the present embodiment it is made of aluminium.

The next step involves applying a primer layer 7 onto the outer surface 9 of the respective aircraft structure component outer skin 3 (step a.a). The primer layer 7 may be of any suitable material and may be applied by the same procedure as the particles of electrically conductive material 11 (see below, step b.) and/or the particles of electrically insulating material 13 (see below, step c.) are applied onto said outer skin 3 outer surface 9, i.e. for example by means of an ink jet printing device 15.

The primer layer 7 serves as an adhesion promoter for the following layers of particles of electrically conductive and/or electrically insulating material 11, 13. However, in other embodiments of the present invention the application of a primer layer 7 may also be skipped, as indicated in FIG. 1 by dashed arrow X. The primer layer 7 as applied onto the outer surface 9 of the aircraft structure component 1 outer skin 3 is illustrated particularly in FIGS. 2 and 3.

As a following step particles of electrically conductive material 11 are applied onto the primer layer 7 in a predetermined pattern in such a way that electric conductor elements 17 are formed (step b.). Said electrically conductive material may basically be any material showing considerably electric conductivity, such as aluminium, wolfram, brass, iron, chrome, or associated alloys, a semiconductor material such as silicon, or a non-metallic material such as graphite, but in the present embodiment it is a copper material. Said predetermined pattern generally corresponds to the desired shape of the electric conductor elements 17, and in one of the present embodiment comprises a grid 19 of crossed straight lines, as illustrated in FIG. 4. The electric conductor elements 17 may be formed along the aircraft structure component 1 outer skin 3 in such a way that they contact the rivets 21 received in the aircraft structure component 1 outer skin 3, wherein an electric signal (current, voltage etc.) may be guided through the rivets 21 to the inner surface 23 of said aircraft structure component 1 outer skin 3 and into the inside of said aircraft structure component 1, where the signal may e.g. be analysed, processed, or controlled by a respective computer or controlling device. The particles of electrically conductive material 11 may be applied to the outer surface 9 of the aircraft structure component's 1 outer skin 3 by means of a digital printing device, and in the present embodiment is applied by means of an ink jet printing device 15, as it is illustrated in FIG. 2. The electric conductor elements 17 extending on the primer layer 7 on the outer surface 9 of the outer skin 3 of the aircraft structure component 1 are illustrated in FIG. 3.

Subsequently, a step of applying laser radiation 27 onto the electric conductor elements 17 is provided (step b.b). By means of applying laser radiation 27 the particles of electrically conductive material 11 in the electric conductor elements 17 are laser sintered, i.e. melt by the heat transferred by the laser radiation 27. After subsequent solidifying the conductor elements 17 are integrally formed and grain boundaries between adjacent particles have disappeared along which boundaries oxidation processes may have occurred altering the electrical properties of the conductor element. According to the present embodiment the laser radiation 27 is applied by means of a laser device 29 which is preferably arranged adjacent to the ink jet printing device 15 and on a common carrier (not shown) and which is illustrated in FIG. 2, wherein arrow A indicates the moving direction of the laser device 29 together with the ink jet printing device 15 with respect to the coated and laser sintered outer surface 9 of the aircraft structure component 1 outer skin 3. As shown in FIG. 2 the laser device 29 is arranged behind the ink jet printing device when seen in the moving direction of the devices which easily allows treating the deposited particles with laser radiation directly after deposition. However, in other embodiments of the present invention the application of laser radiation 27 to the electric conductor elements 17 may also be omitted, as indicated in FIG. 1 by dashed arrow Y.

As a following step particles of electrically insulating material 13 are applied onto the outer surface 9 of the outer skin 3 of the aircraft structure component 1, in particular onto the electric conductor elements 17 and onto the primer layer 7, in a predetermined pattern, such that an insulating layer 31 is formed (step c.). Said electrically insulating material may basically be any kind of material having a considerably high electric resistance and adapted to inhibit the flow of electrical current. The insulating layer 31 may be formed in such a predetermined pattern that the electric conductor elements 17 are covered and insulated to the environment where it is desired and necessary. However, depending on the specific desired use of the electric conductor elements 17 parts of said electric conductor elements 17 may remain uncoated and thus open to the environment. Depending on the kind of electrically conductive material used for the insulating layer 31 a step of applying laser radiation 27 to the insulating layer 31 may follow step c. in order to laser sinter the said insulating layer 31, i.e. melt the particles of electrically insulating material 13, thereby forming a layer with almost no grain boundaries. The insulating layer 31 applied onto the electric conductor elements 17 and onto the primer layer 7 is illustrated in FIG. 3. In other embodiments of the present invention particles of electrically insulating material 13 may be applied to the aircraft structure component 1 outer skin 3 outer surface 9 and, if applicable, to the primer layer 7 before the application of particles of electrically conductive material 11, as illustrated in FIG. 1 by dashed arrows X, Y, and Z, in order to insulate the electric conductor elements 17 to said outer skin 3. In further embodiments of the present invention the application of particles of electrically conductive material 11 and particles of electrically insulating material 13 may be repeated in a certain order and in certain predetermined patterns, such that various electric circuit elements, such as resistors, diodes, transistors, capacitors, inductors, operational amplifiers may be formed.

In conclusion, with the method of the present invention it is possible to produce in a simple and cost-effective manner an aircraft structure component 1 having an outer skin 3 provided with electric conductor elements 17. Such electric conductor elements 17 may serve for various applications, for instance, as a lightning protection arrangement comprising a grid 19 of multiple electric conductor elements 17, as a health monitoring system comprising a plurality of electric conductor elements 17 formed as resistance strain gauges for detecting strain occurring on the respective aircraft structure component 1, as a deicing arrangement comprising a grid 19 of multiple electric conductor elements 17 formed as heating resistance elements, as a illuminating arrangement comprising a plurality of electric conductor elements 17 formed as illuminating elements, e.g. by means of carbon nano tubes admixed to the particles of electrically conductive material 11, or as an electronic system comprising electric circuit elements formed by applying particles of electrically conductive and electrically insulating material 11, 13 repeatedly in a certain order and in certain predetermined patterns. However, in the embodiment shown in FIG. 4 the electric conductor elements 17 are effective as a shielding arrangement 33 for shielding electromagnetic perturbation radiation, in particular cosmic radiation 34. Said shielding arrangement comprises a grid 19 of multiple electric conductor elements 17 arranged along the outer surface 9 of the outer skin 3 of the fuselage front section 5, as it is illustrated in FIG. 4. By means of such shielding arrangement 33 passengers and crew onboard of the respective aircraft can be effectively protected from cosmic radiation, which generally poses a considerable health risk for the people frequently travelling by plane.

Figure 5:
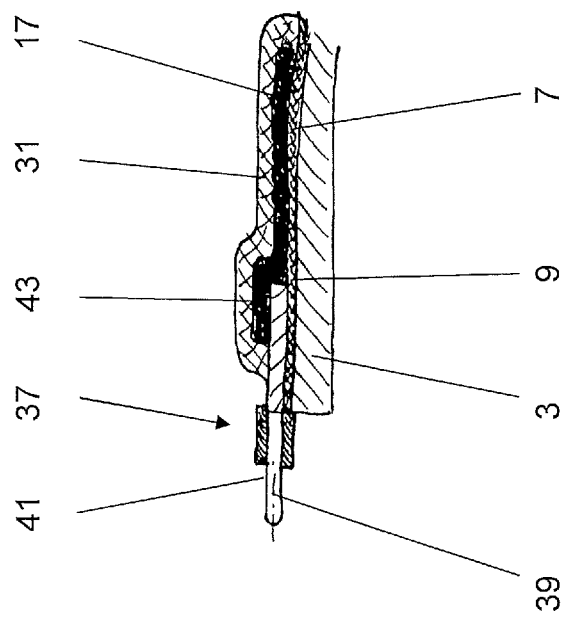
Figure 6:
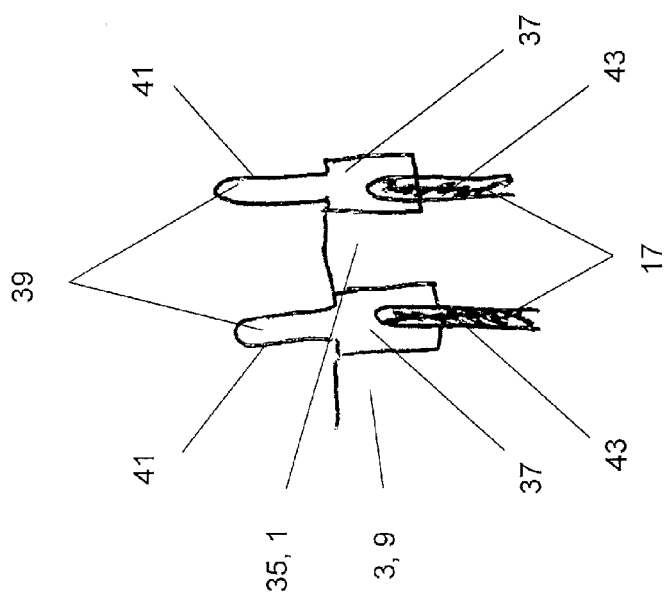

The fuselage front section 5 illustrated in FIG. 4 on its cabin door 35 may comprise a plurality of plug elements 37, as they are illustrated in FIGS. 5 and 6. Each plug element 37 comprises a pin 39 having an outer surface 41 onto which particles of electrically conductive material 11 are applied in order to form an electrically conductive outer contact layer 43 along the outer surface 41 of the pin 39. The application of said particles of electrically conductive material 11 is carried out in the same procedure as explained above under step b., i.e. in a predetermined pattern and preferably by means of an ink jet printing device 15. A primer layer 7 may be applied, depending on the material of the pin 39. Also laser radiation 27 may be applied. The electrically conductive outer contact layer 43 is formed such that it is electrically connected to an electric conductor element 17 on the outer surface 9 of the aircraft structure component 1 outer skin (see FIG. 5).

Figure 7:
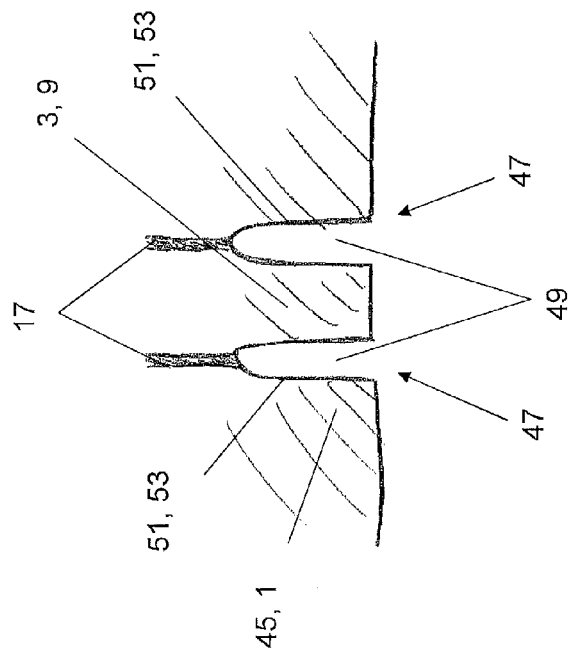

Further, said fuselage front section 5 on its cabin door frame 45 comprises a plurality of socket elements 47, as they are illustrated in FIG. 7. Each socket element 47 comprises a cavity 49 surrounded by a surface 51 of the socket element 47 onto which particles of electrically conductive material 11 are applied in order to form an electrically conductive contact layer 53 along the surface 51 of the socket element 47. The application of said particles of electrically conductive material 11 is carried out in the same procedure as explained above under step b., i.e. in a predetermined pattern and by means of an ink jet printing device 15. A primer layer 7 may be applied, depending on the material of the socket element 47. Also laser radiation 27 may be applied. The electrically conductive contact layer 53 is formed such that it is electrically connected to an electric conductor element 17 on the outer surface 9 of the aircraft structure component 1 outer skin 3 (see FIG. 7).

The plug elements 37 and the socket elements 47 are formed in such a manner that when the cabin door 35 is closed the pins 39 fit inside the cavities 49, wherein the electrically conductive outer contact layers 43 contact the electrically conductive inner contact layers 53, so that a releasable electric connection is established between the electric conductor elements 17 on the outer surface 9 of the outer skin 3 of the cabin door 35 and the electric conductor elements 17 on the outer surface 9 of the outer skin 3 of the fuselage front section 5 besides the cabin door 35. When the cabin door 35 is opened, the pin 39 may slide out of the cavity 49 and said electrical connection is disconnected.

Figure 9:
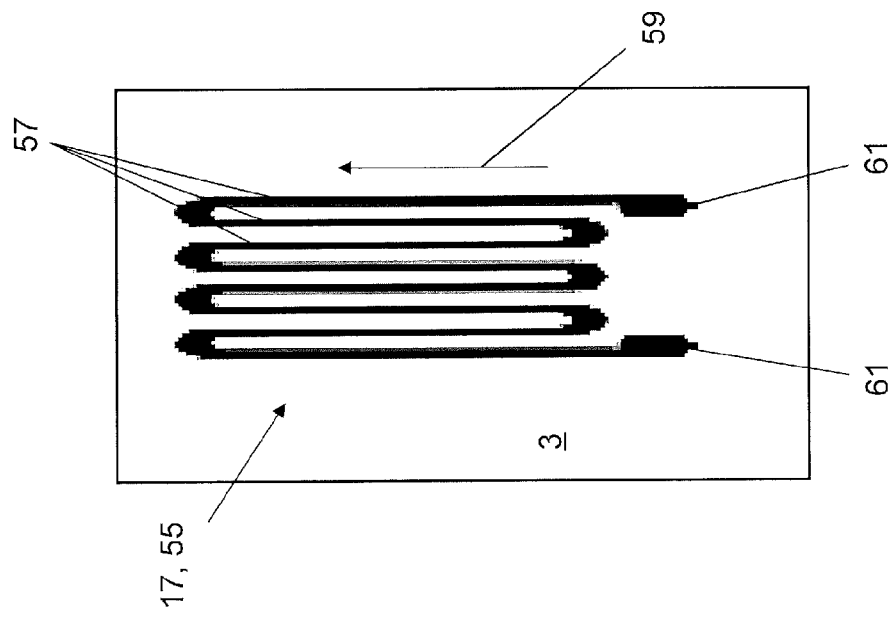
Figure 8:
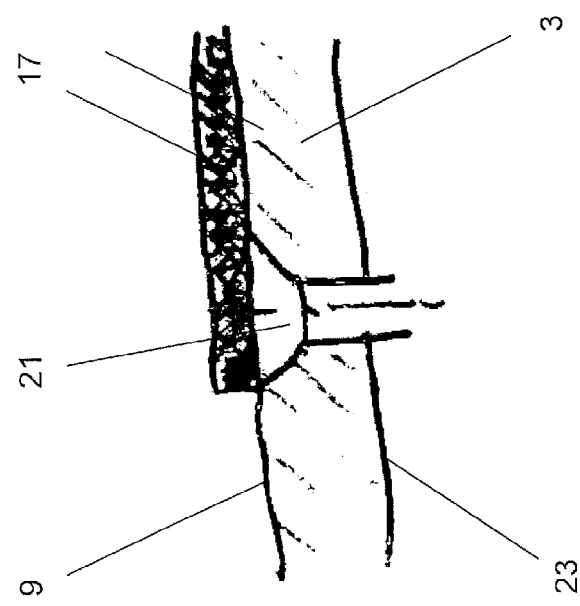

A further embodiment of an electric circuit element formed with the method according to present invention is shown in plane view in FIG. 9.

A conductor element 17 in the form of a resistance strain gauge 55 is arranged on the outer skin 3 of a structure component, the conductor element 17 preferably being formed by means of an ink jet printing device. The conductor element 17 comprises a plurality of straight conductor sections 57 extending in parallel along a common longitudinal direction 59 and first and second connectors 61. As shown in FIG. 9 the straight conductor sections 57 have a width which is small compared to the length of the conductor section 57 in the longitudinal direction 59. Thus, a change of the dimensions of the substrate for the conductor element 17, i.e. of the outer skin 3, in the longitudinal direction 59 effects a change of the cross section of the conductor sections 57 and, hence, of the resistance.

Thus, continuous monitoring of the resistance of resistance strain gauges 55 arranged on the outer skin 3 of the structure component and connected to a control unit via the connectors 61 allows detecting peaks in the load in the longitudinal direction 59 on that particular component. Further, the method of the present provides for a simple cost-effective way to arrange a plurality of resistance strain gauges 55 on the outer skin 3 and to connect them, preferably via rivets, with a control unit.

In summary, the method of the present invention provides for a simple and cost-effective process to arrange electric circuit elements or simple conductors on the outer skin of a structure component of an aircraft without altering the properties of the outer surface.

The invention claimed is:

1. A method for producing an aircraft structure component having an outer skin provided with electric conductor elements, the method comprising:
   a. providing the aircraft structure component having the outer skin,
   b. applying particles of electrically conductive material onto an outer surface of the outer skin of the aircraft structure component in a predetermined pattern, such that accumulated particles of the electrically conductive material form electric conductor elements along the outer surface of the outer skin, and
   c. applying particles of electrically insulating material onto the outer surface of the outer skin of the aircraft structure component in a predetermined pattern, such that accumulated particles of the electrically insulating material form an insulating layer for the electric conductor elements,
      wherein the electric conductor elements are formed along the outer skin of the aircraft structure component such that the electric conductor elements contact rivets received in the outer skin of the aircraft structure component, so that an electric signal may be guided through the rivets to an inner surface of the outer skin of the aircraft structure component and into an inside of the aircraft structure component,
      wherein the rivets are connected to a computer or to a controlling device.

2. The method according to claim 1, wherein step b. and step c. are carried out repeatedly in such an order and by such predetermined patterns that an electric circuit element is formed on the outer surface of the outer skin.

3. The method of claim 1, wherein the particles of electrically conductive material and/or the particles of electrically insulating material are applied onto the outer surface of the outer skin of the aircraft structure component by an ink jet printing device.

4. The method of claim 1, wherein the electric conductor elements are formed as a lightning protection arrangement.

5. The method of claim 4, wherein the lightning protection arrangement comprises a grid of multiple electric conductor elements.

6. The method of claim 1, wherein the electric conductor elements are formed as resistance strain gauges for detecting strain occurring on the aircraft structure component.

7. The method of claim 1, wherein the electric conductor elements are formed as a resistance heating arrangement.

8. The method of claim 7, wherein the resistance heating arrangement comprises a grid of multiple electric conductor elements formed as heating resistance elements.

9. The method of claim 1, wherein the electric conductor elements are formed as a shielding arrangement for shielding perturbing radiation.

10. The method of claim 9, wherein the shielding arrangement comprises a grid of multiple electric conductor elements.

11. The method of claim 1, wherein the electric conductor elements are formed as an illuminating arrangement comprising one or more illuminating elements.

12. The method of claim 1, wherein the aircraft structure component is provided with at least one plug element having a pin, and that particles of electrically conductive material are applied onto the outer surface of the pin, such that the accumulated particles of electrically conductive material form an electrically conductive outer contact layer along the outer surface of the pin, the electrically conductive outer contact layer being connected to an electric conductor element formed on the outer surface of the outer skin of the aircraft structure component.

13. The method of claim 12, wherein a further aircraft structure component is provided with at least one socket element on the outer skin, the socket element having a cavity, and that particles of electrically conductive material are applied onto a surface of the socket element surrounding the cavity, such that the accumulated particles of electrically conductive material form an electrically conductive contact layer along the surface of the socket element surrounding the cavity, the electrically conductive contact layer being connected to an electric conductor element formed on the outer surface of the outer skin of the further aircraft structure component.

14. The method of claim 13, wherein at least one pin fits inside at least one cavity.

15. The method of claim 1, wherein after the step of applying particles of electrically conductive material onto the outer surface of the outer skin of an aircraft structure component, a step of applying laser radiation onto the electric conductor elements by a laser device is performed.

16. The method of claim 9, wherein the electric conductor elements are formed as a shielding arrangement for shielding cosmic radiation.

* * * * *